United States Patent [19]
Bortolini

[11] Patent Number: 5,483,201
[45] Date of Patent: Jan. 9, 1996

[54] SYNCHRONIZATION CIRCUIT USING A HIGH SPEED DIGITAL SLIP COUNTER

[75] Inventor: James R. Bortolini, Boulder, Colo.

[73] Assignee: AT&T Corp., Murray Hill, N.J.

[21] Appl. No.: 129,537

[22] Filed: Sep. 30, 1993

[51] Int. Cl.⁶ ........................................................ H03L 7/00
[52] U.S. Cl. ................................. 331/1 A; 331/25; 331/44
[58] Field of Search ..................................... 331/1 A, 1 R, 331/44, 25, DIG. 2, 172; 307/525, 526, 527, 528; 328/134; 375/120

[56] References Cited

U.S. PATENT DOCUMENTS

| | | | |
|---|---|---|---|
| 3,806,826 | 4/1974 | Schlosser | 331/1 A |
| 4,498,059 | 2/1985 | Edwards et al. | 331/1 A |
| 4,516,250 | 5/1985 | Grimes | 375/82 |
| 4,516,861 | 5/1985 | Frew et al. | 368/120 |
| 4,780,896 | 10/1988 | Dotter, Jr. | 377/50 |
| 5,023,572 | 6/1991 | Caldwell et al. | 331/10 |
| 5,045,813 | 9/1991 | Yamashita et al. | 331/16 |

FOREIGN PATENT DOCUMENTS

| | | | |
|---|---|---|---|
| 0595013 | 5/1994 | European Pat. Off. | H03L 7/099 |
| 2122822 | 1/1984 | United Kingdom | H03L 7/06 |
| 2229332 | 9/1990 | United Kingdom | 331/172 |

OTHER PUBLICATIONS

Research Disclosure, *Automatic Detection of Oscillator Frequency Drift*, No. 344, Dec. 1992, Havant GB, p. 964.

*Primary Examiner*—Robert J. Pascal
*Assistant Examiner*—David Vu
*Attorney, Agent, or Firm*—John C. Moran

[57] ABSTRACT

Simplifying measurement equipment so that any two frequency sources can be accurately and quantitatively compared to each other. With this simplified measurement equipment, calibration can be performed on an oscillator using an external reference signal, while the oscillator is being used in an active system. By simplifying the measurement equipment, the equipment can be built into a time base unit allowing recalibration to be performed at relatively short time intervals. A frequency difference detector based on ring counters and an existing controller in a telecommunication switching system compare an accurate external reference against an oscillator of the time base unit for calibration in the field. Within the telecommunication switching system, a highly accurate external reference signal is normally available from an interconnected telecommunication network. The use of ring counters in the frequency difference detector allows for simple measurement equipment which adds little to the cost of the time base unit. Further, since measurement equipment is all digital, no tuning of the equipment is necessary as is required of measurement equipment having analog components.

8 Claims, 2 Drawing Sheets

```
LINE 201  0 0 0
          1 0 0
          1 1 0
LINE 202  1 1 1
          0 1 1
          0 0 1
          0 0 0
```

SYNCHRONIZATION CIRCUIT USING A HIGH SPEED DIGITAL SLIP COUNTER

TECHNICAL FIELD

This invention relates to the synchronization of a local oscillator with a remote reference signal, and, in particular, to a synchronization circuit utilizing a digital slip counter that is used to measure the relative time interval error between the local oscillator and the remote reference signal.

BACKGROUND OF THE INVENTION

In precision synchronization systems, a local time base reference of great accuracy and stability is required to generate and measure clock signals in a system within a certain accuracy. These time bases have normally crystal frequency sources; the characteristics of such devices are well known. In addition to variations in output frequency resulting from temperature and supply voltage changes, these devices have an ailing characteristic which implies that, over a long period of time, the output frequency will depart from the desired, nominal value. In order to maintain accuracies required in many telecommunication systems, either expensive oscillators must be used to overcome the aging effect or periodic calibration of the oscillators is required.

Calibration is often done manually; time base units are sent in to a calibration facility for extremely precise applications or can be field adjusted for less critical applications. In either case, the reference frequency source used for calibration must be more accurate than the time base unit to be calibrated. By measuring the adjustable time base with respect to the reference, the correction information can be obtained for adjusting the oscillator of the time base unit. The measurement equipment is extremely complicated and expensive, since it is designed to perform over a large range of frequencies. Additionally, the calibration procedure is expensive and usually requires the unit to be taken out of service.

SUMMARY OF THE INVENTION

This invention is directed to simplifying measurement equipment so that any two frequency sources can be accurately and quantitatively compared to each other. With this simplified measurement equipment, calibration can be performed on an oscillator using an external reference signal, while the oscillator is being used in an active system. By simplifying the measurement equipment, the equipment can be built into a time base unit allowing recalibration to be performed at relatively short time intervals. The invention uses a frequency difference detector based on ring counters and an existing controller in a telecommunication switching system to compare an accurate external reference against an oscillator of the time base unit for calibration in the field. Within the telecommunication switching system, a highly accurate external reference signal is normally available from an interconnected telecommunication network. The use of ring counters in the frequency difference detector allows for simple measurement equipment which adds little to the cost of the time base unit. Further, since measurement equipment is all digital, no tuning of the equipment is necessary as is required of measurement equipment having analog components.

Advantageously, since the measurement equipment is an integral part of the time base unit, small corrections are made over an extended period of time which allows for the calibration of an active time base unit without affecting service.

BRIEF DESCRIPTION OF THE DRAWING

FIG. 2 illustrates the states that a ring counter of FIG. 1 goes through; and

FIG. 3 illustrates, in flow chart form, the program executed by the controller of FIG. 1.

DETAILED DESCRIPTION

Figure 1:
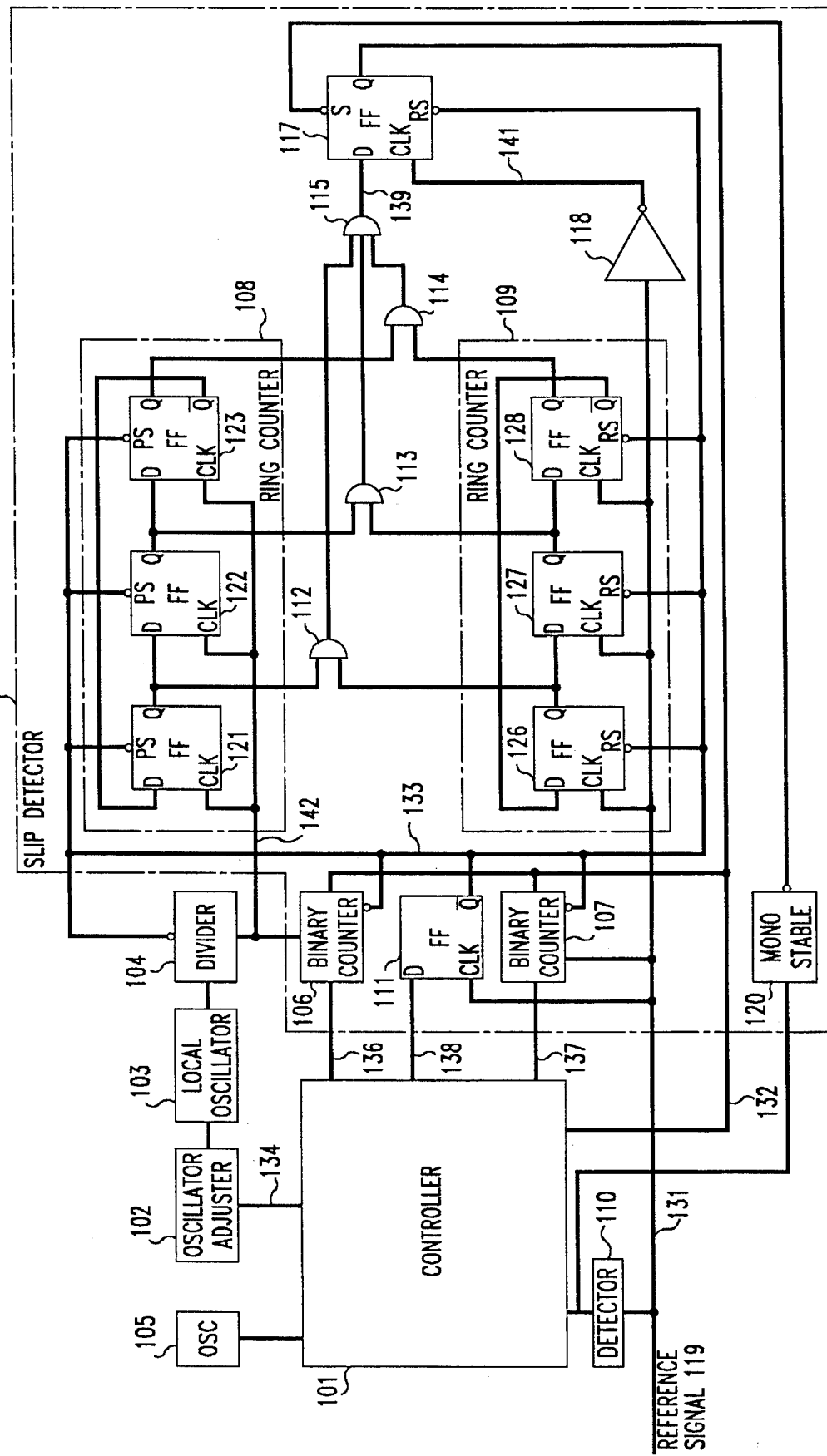
FIG. 1 illustrates a system for calibrating an oscillator from an external reference signal.

FIG. 1 illustrates apparatus for determining the difference between a local time base unit (local oscillator 103 and oscillator adjuster 102) and reference signal 119 being received on conductor 131. Controller 101 supplies overall control for this apparatus. In addition, controller 101 adjusts the frequency of local oscillator 103 via oscillator adjuster 102. Reference signal 119 is illustratively a 64 kHz signal. Local oscillator 103 runs at a nominal value of 5 MHz which is reduced down by divider 104 to a nominal 64 kHz signal on conductor 142. Reference signal 119 is a highly stable accurate external frequency which in telecommunication would be received from the telecommunication network. Slip detector 100 comprises logic circuits 106–109, 111–115, 117, 118, and 120. Ring counters 108 and 109, AND gates 112–115 and flip-flop 117 detect when the relative time interval error (RTIE) between local oscillator 103 and reference signal 119 has exceeded specified number of clock pulses of reference signal 119. Binary counters 106 and 107 are utilized to determine whether the frequency of local oscillator 103 is greater or less than reference signal 119.

Figures 2, 3:
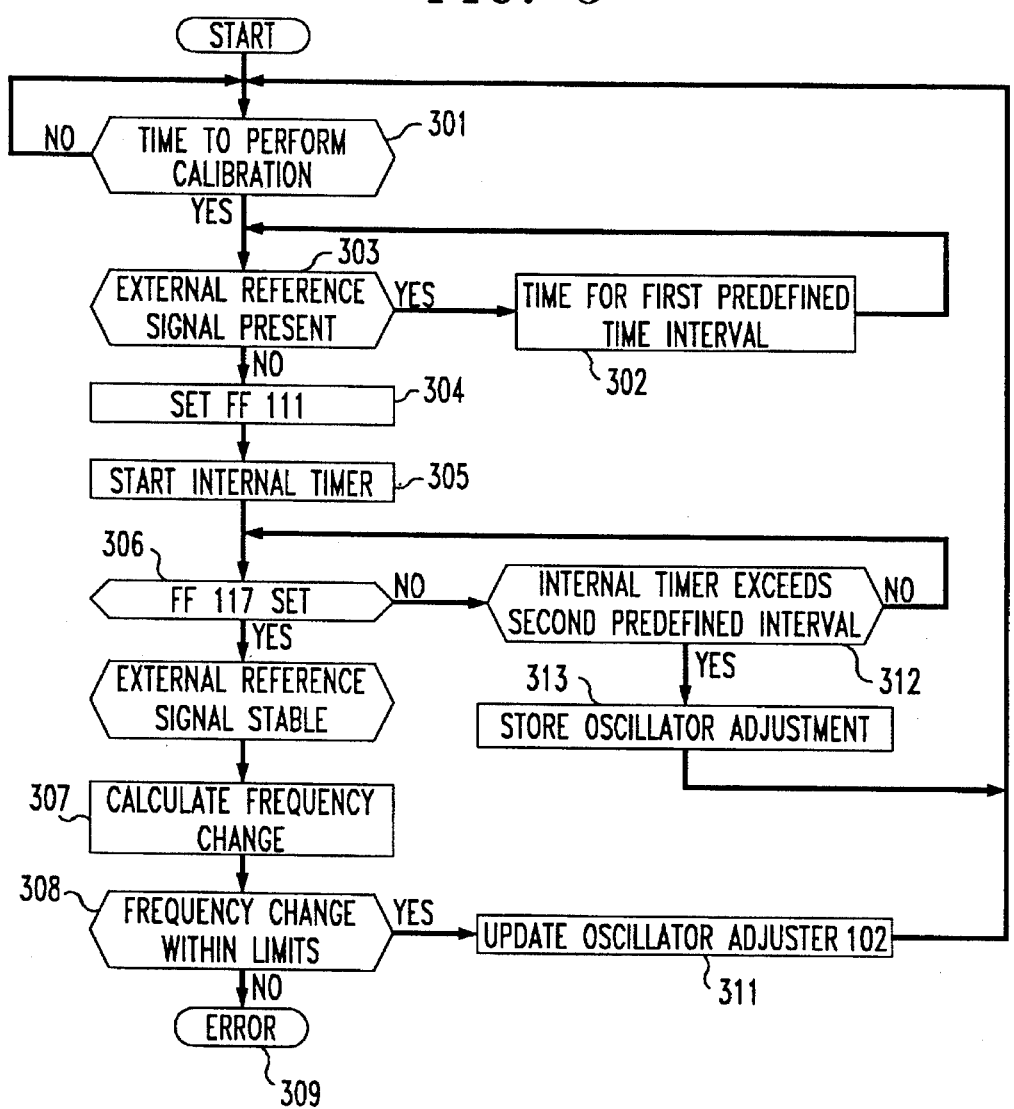

In accordance with the invention, ring counters 108 and 109 are utilized to detect the RTIE between reference signal 119 and the output signal of divider 104 because only one flip-flop of a ring counter changes state for each clock signal as illustrated in FIG. 2. This avoids the problem of race conditions which would be caused by multiple flip-flops simultaneously changing states such as in a binary counter. Race conditions cause momentary "1's" and "0's" to appear on the inputs of AND gates 112–115. This is important, since ring counter 108 is clocked by the output signal from divider 104 and ring counter 109 is clocked by reference signal 119. These two clock signals are not in correlated with each other, hence, potential race conditions would exist if the states of binary counter were compared by AND gates 112–115.

At the beginning of the synchronization process, controller 101 is transmitting a "1" is to the D input of flip-flop 111 via conductor 138 as a result of the last recalibration operation. This "1" is continuously clocked into flip-flop 111 by reference signal 119 resulting in flip-flop 111 being set. When flip-flop 111 is set, a "0" is transmitted on conductor 133. This "0" resets binary counters 106 and 107, divider 104, flip-flop 117, and ring counter 109 and sets ring counter 108. At this point in time, the state of ring counter 109 is shown in line 201 (000) of FIG. 2, and the state of ring counter 108 is shown in line 202 (111) of FIG. 2.

To start the synchronization process, controller 101 supplies a "0" on conductor 138 which resets flip-flop 111. In the reset state, flip-flop 111 transmits a "1" on conductor 133. The "1" on conductor 133 removes the reset input to ring counter 109, flip-flop 117, binary counter 107, binary counter 106, and divider 104, and the set input to ring counter 108. With flip-flop 117 in the reset state, the clock enable inputs of binary counter 106 and binary counter 107 are enabled. All counters commence counting in response to their clock input signals.

Counters 106–109 count at a nominal frequency of 64 kHz. Binary counter 106 and ring counter 108 are clocked by the signal from divider 104 received via conductor 142, and binary counter 107 and ring counter 109 are clocked by reference signal 119 received via conductor 131. AND gates 112, 113, and 114 compare the stages of ring counters 108 and 109. An AND gate outputs a "1", if both of its corresponding stages in ring counters 108 and 109 are at a "1" state. After some period of time, if a frequency difference exists between oscillator 103 and reference signal 119, ring counter 108 and ring counter 109 will be simultaneously in the "1" state in all stages together. When this occurs, AND gates 112–114 transmit "1s" to AND gate 115 which transmits a "1" via conductor 139 to flip-flop 117. The "1" on conductor 139 is synchronously clocked into flip-flop 117 and sets that flip-flop on the inverted state of reference signal 119 on conductor 131. In the set state, flip-flop 117 transmits a "1" on conductor 132. A "1" on conductor 132, inhibits the counting by binary counters 106 and 107 which saves their contents for later reading by controller 101. Since flip-flop 117 is clocked by inverter 118 inverting reference signal 119, ring counter 108 and ring counter 109 will be simultaneously in the "111" state after a difference of 2.5 clock pulses of reference signal 119 have occurred if the frequency of reference signal 119 is greater than oscillator 103 and after a difference of 3.5 pulses of reference signal 119 have occurred if the frequency of reference signal 119 is less than oscillator 103. Controller 101 uses the contents of binary counter 106 and binary counter 107 to determine the time interval to be used for calculating the adjustment to oscillator 103.

Controller 101 is responsive to a "1" received from flip-flop 117 via conductor 132 to determine the time that has lapsed between the starting of the ring counters and the presence of a "1" on conductor 132. This time defines the difference in frequency between local oscillator 103 and reference signal 119. Controller 101 calculates this time interval utilizing oscillator 105 as its time base. Whereas, oscillator 105 is not as accurate as local oscillator 103, the time interval between the starting of the ring counters and the presence of "1" on conductor 132 is illustratively many hundreds of seconds; hence, the accuracy of oscillator 105 does not have to approach that of local oscillator 103. Controller 101 determines an adjustment to be made to the frequency of local oscillator 103 and then makes that adjustment using oscillator adjuster 102. This adjustment causes local oscillator 103 to more closely approach the frequency of reference signal 119. Once again, controller 101 actuates the counting by ring counters 108 and 109. The resulting time interval before the ring counters have a RTIE equal to the specified clock times should be larger the second time. This clearly shows that oscillator 105 does not have to approach the accuracy of local oscillator 103 in order to be able to adjust local oscillator 103 to approach the frequency of reference signal 119.

If reference signal 119 becomes unstable, this condition is detected by detector 110 which signals this fact to controller 101. In addition, the output of detector 110 causes monostable 120 to transmit a pulse to the set input of flip-flop 117 setting flip-flop 117. As previously described, controller 101 responds to the setting of flip-flop 117; however as is detailed in FIG. 3, controller 101 determines by reading detector 110 that an error has occurred.

FIG. 3 illustrates, in flowchart form, the functions performed by controller 101. Decision block 301 determines, when sufficient time has elapsed since the last calibration procedure. If sufficient time has elapsed control is transferred to decision block 303. The latter block checks detector 110 to establish that reference signal 119 is present. If reference signal 119 is not present, control is transferred to block 302 which times for a first predefined time interval before transferring control back to decision block 303.

If the reference signal 119 is present, control is transferred to block 304 which sets flip-flop 111. The setting of flip-flop 111 actuates counters 106 through 109. Control is then transferred to block 305 which starts an internal. software timer in controller 101. Block 305 then transfers control to decision block 306.

Decision blocks 306 and 312 determine when sufficient time has elapsed for the output of divider 104 and reference signal 119 to become 3 clock pulses out of synchronization. Decision block 312 is used to assure that controller 101 does not wait more than a second predefined interval of time for flip-flop 117 to be set. If this second predefined interval of time is exceeded, then oscillator 103 meets the specifications with respect to reference signal 119 and control is transferred to block 313. The latter block stores the value used to adjust adjuster 102 and transfers control back to block 301.

Once flip-flop 117 is set, block 310 checks to assure that the reference signal 119 has been stable during the recalibration procedure. If reference signal 119 has been stable, control is transferred to block 307 which calculates the frequency change for oscillator 103. The calculated change is checked by decision block 308 to make sure that it is reasonable. If the calculated change is not reasonable, control is transferred to block 309 for error recovery. If the calculated change is reasonable, block 311 updates oscillator adjuster 102 and returns control to decision block 301. If reference signal 119 was not stable, control is transferred to block 309 for error recovery.

I claim:

1. An apparatus for detecting a difference in frequency between an oscillator and a reference signal, comprising:

means for controlling a starting of a first ring counter for counting at a frequency of the oscillator and of a second ring counter for counting at a frequency of the reference signal;

means for generating a signal when count of the first ring counter differs from count of the second ring counter by a predetermined amount;

the controlling means responsive to the signal from the generating means for calculating a difference in frequency between the oscillator and the reference signal;

the controlling means comprises means for processing under control of a stored program;

means for timing; and the processing means for starting the timing means when starting the counting means and responsive to the signal from the generating means for reading the timing means to calculate the difference.

2. The apparatus of claim 1 wherein the processing means further adapted for calculating a correction signal for the oscillator to reduce the difference between the frequency of the oscillator and the frequency of the reference signal.

3. The apparatus of claim 2 further comprises means for determining the stability of the reference signal and the processing means further responsive to the determined stability for reading the timing means to calculate the difference.

4. The apparatus of claim 3 further comprises a third counter clocked at the frequency of the oscillator and a fourth counter clocked at the frequency of reference signal; and the processing means further adapted for calculating the difference in frequency between the oscillator and the reference signal by reading the contents of the third and fourth counters.

5. A method for detecting a difference in frequency between an oscillator and a reference signal, the method comprising the steps of:

controlling a starting of a first ring counter for counting at a frequency of the oscillator and of a second ting counter for counting at a frequency of the reference signal;

generating a signal when count of the first ring counter differs from count of the second ring counter by a predetermined amount;

the controlling step responsive to the signal from the generating step for calculating a difference in frequency between the oscillator and the reference signal;

the controlling step comprises the steps of processing under control of a stored program; timing; and the processing step starting the timing step when starting the ring counters and responsive to the signal from the generating step for reading results of the timing step to calculate the difference.

6. The method of claim 5 wherein the processing step further adapted for calculating a correction signal for the oscillator to reduce the difference between the frequency of the oscillator and the frequency of the reference signal.

7. The method of claim 6 further comprises the step of determining the stability of the reference signal and the processing step further responsive to the determined stability for reading the results of the timing step to calculate the difference.

8. The method of claim 7 further comprises the steps of counting with a third counter clocked at the frequency of the oscillator and counting with a fourth counter clocked at the frequency of reference signal and the processing step further adapted for calculating the difference in frequency between the oscillator and the reference signal by reading the contents of the third and fourth counters.

* * * * *